United States Patent [19]

Young

[11] Patent Number: 5,408,053
[45] Date of Patent: Apr. 18, 1995

[54] LAYERED PLANAR TRANSMISSION LINES

[75] Inventor: Brian D. Young, Austin, Tex.

[73] Assignee: Hughes Aircraft Company, Los Angeles, Calif.

[21] Appl. No.: 160,015

[22] Filed: Nov. 30, 1993

[51] Int. Cl.⁶ .............................................. H05K 1/00
[52] U.S. Cl. .................................. 174/264; 174/262; 361/792; 361/794
[58] Field of Search ............... 174/262, 263, 264, 265, 174/266; 361/784, 792, 794

[56] References Cited

U.S. PATENT DOCUMENTS 5,120,384  6/1992  Yoshimitsu et al. .
5,245,136  9/1993  Chance et al. .
5,262,595  11/1993  Yano et al. .

Primary Examiner—Leo P. Picard
Assistant Examiner—Cheryl R. Figlin
Attorney, Agent, or Firm—L. A. Alkov; W. K. Denson-Low

[57] ABSTRACT

A transmission line structure including a central signal conductor stack of elongated conductive strips separated from each other by contiguous dielectric layers of a unitized multilayer circuit structure, a first ground conductor stack of elongated conductive strips separated from each other by contiguous dielectric layers and laterally separated from one side of the central signal conductor stack, and a second ground conductor stack of elongated conductive strips separated from each other by contiguous dielectric layers and laterally separated from another side of the central signal conductor stack such that the central conductor stack is laterally between the first and second ground conductor stacks.

10 Claims, 1 Drawing Sheet

5,408,053

LAYERED PLANAR TRANSMISSION LINES

BACKGROUND OF THE INVENTION

The disclosed invention is directed generally to hybrid multilayer circuit structures, and is directed more particularly to layered planar transmission lines formed in a hybrid multilayer circuit structure.

Hybrid multilayer circuit structures, also known as hybrid microcircuits, implement the interconnection and packaging of circuit devices (e.g., integrated circuits), and generally include a unitized multilayer circuit structure formed from a plurality of integrally fused insulating layers (e.g., ceramic layers) having conductor traces disposed therebetween. The circuit devices are commonly mounted on the top insulating layer so as not to be covered by another insulating layer or on an insulating layer having die cutouts formed thereon to provide cavities for the circuit devices. Passive components such as capacitors and resistors can be formed on the same layer that supports the circuit devices, for example, by thick film processes, or they can be formed between the insulating layers, for example, also by thick film processes. Electrical interconnection of the conductors and components on the different layers is achieved with vias or holes appropriately located and formed in the insulating layers and filled with conductive via fill material, whereby the conductive material is in contact with predetermined conductive traces between the layers that extend over or under the vias.

Hybrid multilayer circuit structures are now being utilized for RF applications wherein microwave integrated circuits (MICs) and/or monolithic microwave integrated circuits (MMICs) mounted on a hybrid are interconnected by transmission structures formed on the multilayer structure, for example pursuant to screen printing or metal deposition.

A consideration with implementing transmission structures in hybrid multilayer circuit structures is high frequency attenuation due to conductor losses. For example, for a microstrip transmission structure that includes metal on both sides of a substrate, conductor loss is determined by strip width which is constrained by the need for a particular characteristic impedance, which prevents conductor loss from being independently tuned. Similarly, for a transmission structure comprised of a stripline that is buried between two wide conductive plates, conductor loss is determined by the stripline width which is constrained by the need for a particular characteristic impedance.

For a coplanar waveguide comprised of coplanar conductive lines, strip width and thickness can be selected to reduce conductor loss, and then gap width is constrained by the desired characteristic impedance. However, increasing strip width might not appreciably reduce losses since the current crowds the edges of the metallization, and increased strip thickness might constrained by process limitations.

SUMMARY OF THE INVENTION

It would therefore be an advantage to provide a transmission line structure for a multilayer circuit structure that provides for reduced conductor loss while allowing configuration for a desired characteristic impedance.

The foregoing and other advantages are provided by the invention in a transmission line structure that includes a central signal conductor stack of elongated conductive strips separated from each other by contiguous dielectric layers of a unitized multilayer circuit structure, a plurality of conductive vias interconnecting the conductive strips of the signal conductor stack, a first ground conductor stack of elongated conductive strips separated from each other by contiguous dielectric layers and laterally separated from one side of the first signal conductor stack, a plurality of conductive vias interconnecting the conductive strips of the first ground conductor stack, a second ground conductor stack of elongated conductive strips separated from each other by contiguous dielectric layers and laterally separated from another side of the central conductor stack, and a plurality of conductive vias interconnecting the conductive strips of the second ground conductor stack, whereby the central signal conductor stack is laterally between the first and second ground conductor stacks.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION OF THE DISCLOSURE

Figure 1:
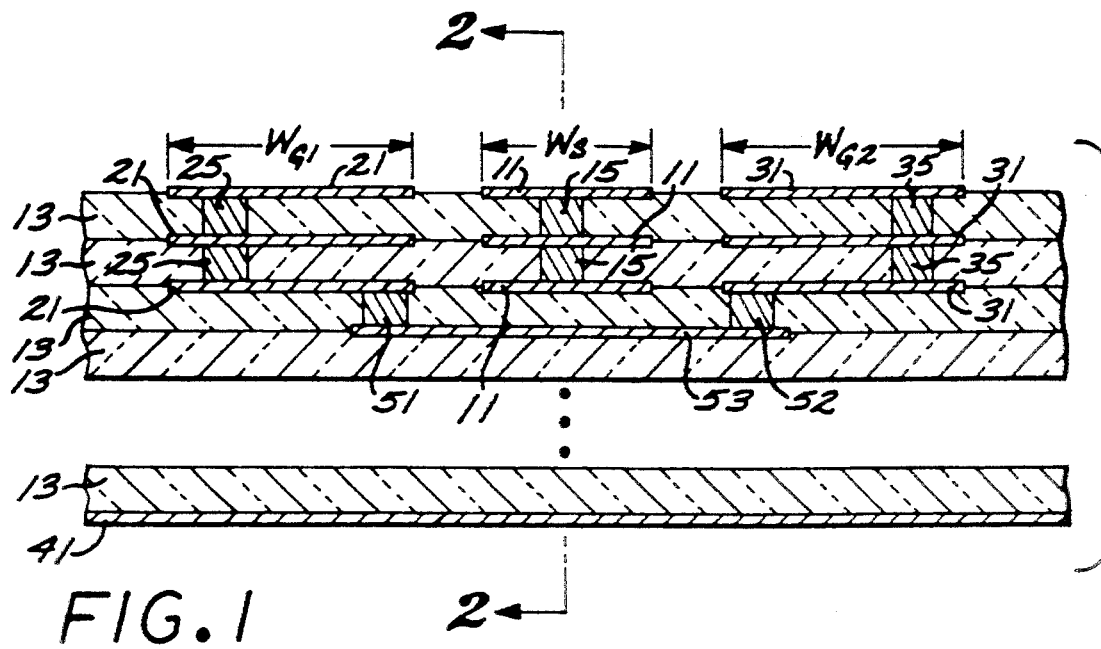
FIG. 1 is an end elevational sectional view of a layered 3-conductor planar transmission line in accordance with the invention.

In the following detailed description and in the several figures of the drawing, like elements are identified with like reference numerals.

A layered planar transmission line structure in accordance with the invention is implemented in a unitized multilayer circuit structure that is utilized for interconnecting various circuit devices such as MICs and/or MMICs mounted on the outside of the unitized structure. The unitized multilayer circuit structure is formed from a plurality of dielectric layers (comprising ceramic, for example), conductive traces disposed between the layers and on the top layer (including for example microstrip lines), and conductive vias formed in the dielectric layers which together with any buried elements (e.g., elements formed on the top of a dielectric layer and covered by an overlying dielectric layer) are processed to form an integrally fused unitized multilayer structure. After the unitizing fabrication, appropriate metallization is applied to the outside of the unitized structure, and the circuit devices are mounted and electrically connected.

Figure 2:
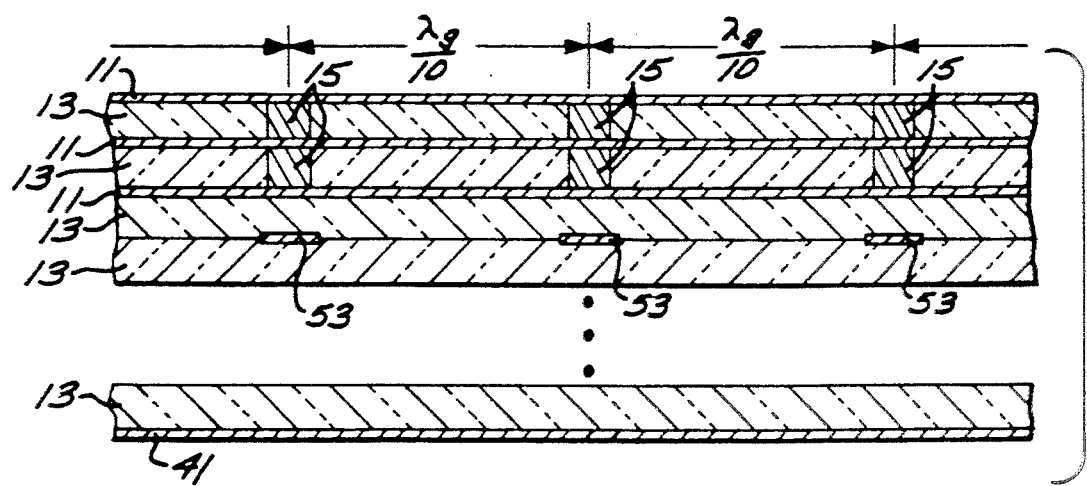
FIG. 2 is a side elevational sectional view of the layered 3-conductor planar transmission line of FIG. 1.

Referring now to FIGS. 1 and 2, set forth therein are end elevational and side elevational sectional views of a layered 3-conductor planar transmission line in accordance with the invention which includes a central signal conductor stack comprised of a plurality of elongated conductive strips 11 arranged in a vertical stack and vertically separated by contiguous dielectric layers 13 of the unitized multilayer circuit structure in which the planar transmission line is implemented. The number of elongated conductive strips 11 is at least 2, and will depend upon the desired reduction of conductor loss as well as the region of the multilayer circuit structure that can be allocated to the planar transmission line. By way of illustrative example, the elongated conductive strips 11 of the central signal conductor stack are of uniform width $W_s$, although the invention contemplates conductive strips 11 of non-uniform widths. The conductive strips 11 of the central stack are electrically interconnected by conductive vias 15 which are arranged in a plurality of vertical via columns. The columns of vias 15 are distributed along the extent of the elongated conductive strips 11 of the central conductor stack and spaced from each other by $\lambda g/10$ or less, wherein $\lambda g$ is the guide wavelength.

The layered planar transmission line of the invention further includes a first ground conductor stack comprised of a plurality of elongated conductive strips 21 arranged in a vertical stack that is laterally adjacent one side of the central signal conductor stack. The elongated conductive strips 21 of the first ground conductor stack are vertically separated by dielectric layers 13 of the multilayer circuit structure in which the layered planar transmission line is implemented, and the number of elongated conductive strips 21 can be the same as the number of elongated conductive strips 11 in the central signal conductor stack. For example, the conductive strips 11 and the conductive strips 21 can be correspondingly layered wherein each conductive strip 11 of the central conductor stack is laterally spaced from a corresponding adjacent conductive strip 21 of the first ground conductor stack by a lateral gap. Alternatively, the number of elongated strips 21 of the first ground conductor stack can be less or more than the number of elongated conductive strips 11 in the central signal conductor stack. By way of illustrative example, the elongated conductive strips 21 of the first ground conductor stack are of uniform width $W_{G1}$, although the invention contemplates conductive strips 21 of non-uniform widths. By way of further illustrative example, the lateral gaps between corresponding elongated conductive strips 21 and elongated conductive strips 11 are of a uniform gap width G1, although the invention contemplates non-uniform gap widths. The conductive strips 21 of the first ground conductor stack are electrically interconnected by conductive vias 25 which are arranged in a plurality of vertical via columns. The columns of vias 25 are distributed along the extent of the elongated conductive strips 21 of the first ground conductor stack and are spaced from each other by $\lambda g/10$, wherein $\lambda g$ is the guide wavelength.

The layered planar transmission line of the invention further includes a second ground conductor stack of N elongated conductive strips 31 arranged in a vertical stack that is laterally adjacent the side of the central conductor stack that is opposite the side adjacent the first ground conductor stack, such that the central conductor stack is laterally between the first and second ground conductor stacks. The elongated conductive strips 31 of the second ground conductor stack are vertically separated by dielectric layers 13 of the unitized multilayer circuit structure in which the layered planar transmission line is implemented, and the number of elongated conductive strips 31 can be the same as the number of elongated conductive strips 11 in the central signal conductor stack. For example, the conductive strips 11 and the conductive strips 31 can be correspondingly layered wherein each conductive strip 11 of the central conductor stack is laterally spaced from a corresponding adjacent conductive strip 31 of the second ground conductor stack by a lateral gap. Alternatively, the number of elongated strips 31 of the second ground conductor stack can be less or more than the number of elongated conductive strips 11 in the central signal conductor stack. By way of illustrative example, the elongated conductive strips 31 of the second ground conductor stack are of uniform width $W_{G2}$, although the invention contemplates conductive strips 31 of non-uniform widths. By way of further illustrative example, the lateral gaps between corresponding elongated conductive strips 31 and elongated conductive strips 11 are of a uniform gap width G2, although the invention contemplates non-uniform gap widths. The conductive strips 31 of the second ground conductor stack are electrically interconnected by conductive vias 35 which are arranged in a plurality of vertical via columns. The columns of vias 35 are distributed along the extent of the elongated conductive strips 31 of the second ground conductor stack and are spaced from each other by $\lambda g/10$ or less, wherein $\lambda g$ is the guide wavelength.

It should be appreciated that while the interconnecting vias of each conductor stack is shown as being arranged in columns, the interconnecting vias can be staggered from one insulating layer to the next, so long as the spacing between vis in a given insulating layer is $\lambda g/10$ or less.

The first and second ground stacks are shorted together along the length of the waveguide at intervals of $\lambda g/10$ or less, wherein $\lambda g$ is the guide wavelength, to maintain a constant potential between the two. By way of illustrative example, such shorting can be implemented by conductive vias 51, 52 in a dielectric layer on which coplanar conductive strips of the first and second ground conductor stacks are disposed, and an interconnecting conductive trace 53 that is transverse to the longitudinal extent of the waveguide and connected to the lower ends of the conductive vias 51, 52. The conductive vias 51, 52 are in contact with respective overlying (and/or underlying) conductive strips of the first and second ground conductor stacks, and are preferably close the inside edges of such respective conductive strips. By way of illustrative example, as shown in FIGS. 1 and 2, the transverse conductive trace 53 can underlie the lowermost conductive strip 11 of the central signal conductor stack. Alternatively, to the extent that the transverse conductive trace 53 is coplanar with one of the conductive strips 11 of the central signal conductor stack, such conductive strip 11 would contain a gap at the location where the transverse conductive trace crosses the conductive strip 11 such that the conductive strip 11 and the transverse conductive strip are electrically isolated.

While the signal and ground conductor stacks are shown as being vertically aligned, it should be appreciated that the stacks can be vertically staggered. Also, the number of conductive traces in one of the ground conductor stacks can be different from the number of conductive traces in the other ground stack.

In accordance with conventional practice, the unitized multilayer circuit structure in which a transmission line in accordance with the invention is implemented can include a ground plane 41 disposed on the bottom side of the lowermost insulating layer 13.

In a coplanar waveguide, current flows at the edges as a result of skin effects, and therefore the invention provides for reduced conductor loss since the number of edges is increased. In particular, increasing the number of conductive strips in each conductive line to N reduces conductor loss by about a factor of N. The use of conductive lines comprised of stacked interconnected conductive strips further allows for control of the characteristic impedance of the transmission line without imposing constraints on the amount of reduction of conductor loss. The characteristic impedance $Z_o$ of a transmission line is expressed as $Z_o=(L/C)^{\frac{1}{2}}$ wherein L is the inductance per unit length and C is the capacitance per unit length. Taking a single layer transmission line as a reference line having an inductance per unit length of L and a capacitance per unit length of C, increasing the number of conductive strips in each line to N for an implementation wherein the conductor stacks are vertically aligned will approximately reduce the inductance per unit length to L/N and increase the capacitance per unit length to C*N, and the characteristic impedance will be $Z_o=(L/C)^{\frac{1}{2}}/N$. In order to restore the characteristic impedance to the same level as the single layer transmission line, the single layer inductance per unit length L must increase by $N^2$ or the single layer capacitance per unit length C must decrease by $N^2$. Reducing L will result in higher conductor loss since the only way to reduce L is to reduce the width of the lines. However, C can be reduced by moving the conductor stacks apart; i.e., increase the gaps. Thus, not only will the characteristic impedance be restored, but conductor loss will be further reduced due to the spreading of the field caused by moving the conductor stacks further apart.

From the foregoing, it should be appreciated that the dimensions of a planar layered transmission line in accordance with the invention are not constrained by the characteristic impedance since two degrees of freedom exist; namely, strip widths and gap widths. In the single layer transmission line, there is only one degree of freedom, since selecting the gap width sets the strip width for a particular impedance, and selecting the strip width sets the gap width for a particular impedance.

While the foregoing has been directed to a 3-wire layered planar transmission line, the invention also contemplates a 2-wire layered planar transmission line wherein one of the ground conductor stacks is not utilized. Such 2-wire layer planar transmission line would be similar to a slotline transmission line. The 2-wire layered planar transmission line provides for reduced conductor loss for the same reasons discussed above for the 3-wire layered planar transmission line.

A layered planar transmission line in accordance with the invention can be made pursuant to low temperature co-fired processing, and moreover advantageously allows for implementation pursuant to high temperature co-fired processing. For example, aluminum nitride (AlN) is highly desirable as a cofired microwave dielectric for high power microwave applications, but its very high firing temperature mandates the use of refractory metals such as tungsten which produces transmission lines with about $(2.4)^{\frac{1}{2}}$ times the conductor loss of transmission lines made of gold which can only be used with low temperature co-fired processing. However, using the a stacked 3-wire transmission line as disclosed herein, a 3-layer line would produce less conductor loss that a single layer 3-wire line of gold.

Although the foregoing has been a description and illustration of specific embodiments of the invention, various modifications and changes thereto can be made by persons skilled in the art without departing from the scope and spirit of the invention as defined by the following claims.

What is claimed is:

1. A transmission line structure formed in a unitized multilayer circuit structure comprised of a vertical stack of dielectric layers, the transmission line structure comprising:
   a vertical central signal conductor stack of elongated conductive strips vertically separated from each other by respective contiguous dielectric layers of the vertical stack of dielectric layers;
   a plurality of conductive vias interconnecting the elongated conductive strips of said vertical central signal conductor stack;
   a first vertical ground conductor stack of elongated conductive strips vertically separated from each other by respective contiguous dielectric layers of the vertical stack of dielectric layers and laterally separated from one side of said vertical central conductor stack such that said first vertical ground conductor stack of elongated conductive strips and said vertical central conductor stack are side by side along the elongated extents thereof;
   a plurality of conductive vias interconnecting the elongated conductive strips of said first vertical ground conductor stack;
   a second vertical ground conductor stack of elongated conductive strips vertically separated from each other by respective contiguous dielectric layers of the vertical stack of dielectric layers and laterally separated from another side of said vertical central conductor stack such that the vertical central conductor stack is laterally between the first and second vertical ground conductor stacks, and such that said vertical central conductor vertical stack, said first vertical ground conductor vertical stack, and said second vertical ground conductor vertical stack are side by side along the elongated extents thereof;
   a plurality of conductive vias interconnecting the elongated conductive strips of said first vertical ground conductor stack; and
   means for electrically connecting said first vertical ground conductor stack to said second vertical ground conductor stack at intervals along the elongated extents of said first and second vertical ground conductor stacks.

2. The transmission line structure of claim 1 wherein each of said vertical central conductor stack, said first vertical ground conductor stack, and said second vertical ground conductor stack includes an identical number of elongated conductive strips.

3. The transmission line structure of claim 2 wherein the elongated conductive strips of said vertical central conductor stack, said first vertical ground conductor stack, and said second vertical ground conductor stack are separated by predetermined contiguous dielectric layers such that said stacks have correspondingly layered elongated conductive strips wherein each elongated conductive strip of said vertical central conductor stack is laterally between an elongated conductive strip contained in said first vertical ground conductor stack and an elongated conductive strip contained in said second vertical ground conductor stack.

4. The transmission line structure of claim 3 wherein the elongated conductive strips of said vertical central conductor stack are of a uniform width, wherein the elongated conductive strips of said first vertical ground conductor stack are of a uniform width, and wherein the elongated conductive strips of said second vertical ground conductor stack are of a uniform width.

5. The transmission line structure of claim 4 wherein the elongated conductive strips of said vertical central conductor stack are laterally separated by uniform gaps from correspondingly layered elongated conductive strips of said first vertical ground conductor stack, and wherein the elongated conductive strips of said vertical central conductor stack are laterally separated by uniform gaps from correspondingly layered elongated conductive strips of said second vertical ground conductor stack.

6. A transmission line structure formed in a unitized multilayer circuit structure comprised of a vertical stack of dielectric layers, the transmission line structure comprising:
   a vertical signal conductor stack of elongated conductive strips vertically separated from each other by contiguous dielectric layers of the vertical stack of dielectric layers;
   a plurality of conductive vias interconnecting the elongated conductive strips of said vertical signal conductor stack;
   a vertical ground conductor stack of elongated conductive strips vertically separated from each other by contiguous dielectric layers and laterally separated from said vertical signal conductor stack such that said vertical ground conductor stack and said vertical signal conductor stack are side by side along the elongated extents thereof; and
   a plurality of conductive vias interconnecting the elongated conductive strips of said vertical ground conductor stack.

7. The transmission line structure of claim 6 wherein said signal conductor vertical stack and said vertical ground conductor stack include an identical number of elongated conductive strips.

8. The transmission line structure of claim 7 wherein the elongated conductive strips of said vertical signal conductor stack and said vertical ground conductor stack are separated by predetermined contiguous dielectric layers such that said vertical signal conductor stack and said vertical ground conductor stack have correspondingly layered elongated conductive strips wherein each elongated conductive strip of said vertical signal conductor stack is laterally adjacent a conductive strip of said vertical ground conductor stack.

9. The transmission line structure of claim 8 wherein the elongated conductive strips of said vertical signal conductor stack are of a uniform width, and wherein the elongated conductive strips of said vertical ground conductor stack are of a uniform width.

10. The transmission line structure of claim 9 wherein the elongated conductive strips of said vertical signal conductor stack are laterally separated by uniform gaps from correspondingly layered elongated conductive strips of said vertical ground conductor stack.

* * * * *